(12) United States Patent
Wu et al.

(10) Patent No.: US 10,759,039 B2
(45) Date of Patent: Sep. 1, 2020

(54) HANDLE MOUNTING STRUCTURE

(71) Applicant: HANWIT PRECISION INDUSTRIES LTD., New Taipei (TW)

(72) Inventors: Ming-De Wu, New Taipei (TW); Ching-Kai Chang, New Taipei (TW)

(73) Assignee: HANWIT PRECISION INDUSTRIES LTD., New Taipei (TW)

(*) Notice: Subject to any disclaimer, the term of this patent is extended or adjusted under 35 U.S.C. 154(b) by 52 days.

(21) Appl. No.: 16/107,308

(22) Filed: Aug. 21, 2018

(65) Prior Publication Data
US 2020/0061800 A1 Feb. 27, 2020

(51) Int. Cl.
| | | |
|---|---|---|
| *B25G 3/16* | (2006.01) | |
| *B25G 3/08* | (2006.01) | |
| *H05K 5/02* | (2006.01) | |
| *B25G 1/10* | (2006.01) | |
| *H05K 7/14* | (2006.01) | |

(52) U.S. Cl.
CPC ............ *B25G 3/16* (2013.01); *B25G 1/102* (2013.01); *B25G 3/08* (2013.01); *H05K 5/023* (2013.01); *H05K 5/0221* (2013.01); *H05K 7/1488* (2013.01)

(58) Field of Classification Search
CPC ... B25G 3/16; B25G 1/02; B25G 3/08; B25G 3/12; H05K 5/0221; H05K 5/023; H05K 7/1488; G06F 1/187
See application file for complete search history.

(56) References Cited

U.S. PATENT DOCUMENTS

| | | | | |
|---|---|---|---|---|
| 8,118,271 B2* | 2/2012 | Peng | ............... | G06F 1/187 248/221.11 |
| 9,222,291 B2* | 12/2015 | Kakita | ............... | E05C 19/14 |
| 9,605,451 B2* | 3/2017 | Patel | ............... | E05B 79/06 |
| 9,930,804 B2* | 3/2018 | Lu | ............... | H05K 7/1488 |
| 10,228,734 B1* | 3/2019 | Hsieh | ............... | G11B 33/124 |
| 2006/0022563 A1* | 2/2006 | Huruoka | ............... | E05B 65/0053 312/296 |
| 2019/0178564 A1* | 6/2019 | Steiger | ............... | E05D 15/505 |
| 2019/0316391 A1* | 10/2019 | Bacon | ............... | E05B 83/44 |

FOREIGN PATENT DOCUMENTS

KR 20090104392 A * 3/2008

* cited by examiner

*Primary Examiner* — Victor D Batson
*Assistant Examiner* — Matthew J Sullivan
(74) *Attorney, Agent, or Firm* — Muncy, Geissler, Olds & Lowe, P.C.

(57) ABSTRACT

A handle mounting structure includes a handle including a handle shaft with a sliding space defined in one side thereof and a mounting unit located at one end thereof, a locking mechanism including an insert plate slidably inserted into the sliding space and a torsion spring mounted in the sliding space and stopped between the handle and the insert plate to impart a pressure to the insert plate toward the outside of the sliding space, and a positioning device including a flat base pivotally coupled to the handle and a hook block located at a bottom side of the flat base. The handle can be fastened to a sliding box of a cabinet through locking mechanism and the positioning device, so that the handle is not easily separated from the sliding box, and the sliding box can be surely pulled out of or pushed into the cabinet through the handle.

11 Claims, 8 Drawing Sheets

HANDLE MOUNTING STRUCTURE

BACKGROUND OF THE INVENTION

1. Field of the Invention

The present invention relates to a handle mounting structure consisting of a handle, a locking mechanism and a positioning device for quick installation in a sliding box of a cabinet, which has a low-profile characteristic.

2. Description of the Related Art

With the rapid development of electronic technology, computer technology brings convenience, comfort, speed and other high-efficiency functions to people's life and work, so the application function of electronic technology and computer systems is getting stronger and stronger, the application scope is getting wider and wider. Except personal computers for personal application, industrial computer rooms, building central control systems, central control systems of automated plant operation systems, central processing control systems for video and audio playback, etc., are controlled through centralized management by mounting multiple computer hosts, servers, conversion systems in respective sliding boxes that are arranged in a stack inside a cabinet, facilitating operating system installation and individual system maintenance and control. When performing a computer operating system inspecting or updating operation, the sliding boxes must be pulled out of the cabinet one after another. In order to facilitate installation of each individual sliding box in the cabinet or pulling each individual sliding box out of the cabinet, each individual sliding box is equipped with a retaining structure.

However, since the current electronic products are developing toward light, thin, short, and small designs, the cabinet and the internal sliding boxes must be designed to be smaller and smaller. When the sliding box design is getting smaller and smaller, the retaining structure used on the sliding box is bound to be light, thin, short, and small. Therefore, how to make the retaining structure light, thin, short and small, and at the same time has a good retaining effect and structural strength, which is the direction that the relevant industry is eager to study and improve.

SUMMARY OF THE INVENTION

The present invention has been accomplished under the circumstances in view. It is therefore the main object of the present invention to provide a handle mounting structure, which comprises a handle, a locking mechanism and a positioning device. The handle comprises a handle shaft, a sliding space defined in one side of the handle shaft and a mounting unit located at one end of the handle shaft. The locking mechanism is mounted in the sliding space of the handle, comprising an insert plate slidably inserted into the sliding space and a torsion spring mounted in the sliding space of the handle and stopped between the handle and the insert plate to impart a pressure to the insert plate toward the outside of the sliding space. The torsion spring comprises a coiled positioning portion mounted to the handle shaft within the sliding space, an abutment end piece extended from one end of the coiled positioning portion and stopped against the insert plate, and a mounting end piece extended from an opposite end of the coiled positioning portion and positioned in the sliding space. The positioning device comprises a flat base pivotally coupled to the mounting unit of the handle, and a hook block located at a bottom side of the flat base. The handle can be fastened to a sliding box of a cabinet through the locking mechanism and the positioning device, so that the handle is not easily separated from the sliding box, and the sliding box can be surely pulled out of or pushed into the cabinet through the handle. Further, the winding direction of the coiled positioning portion of the torsion spring of the locking mechanism is parallel to the length direction of the handle so that the thickness of the handle mounting structure can be minimized for application to electronic products having light, thin, short and small characteristics.

According to another aspect of the present invention, the outer cover of the locking mechanism is detachably mounted in the sliding space of the handle, facilitating replacement of the torsion spring after dismounting of the outer cover. Further, the outer cover is set in position by means of engaging the positioning lugs thereof into the two opposite gaps in handle shaft without additional fastening members, facilitating quick installation.

According to another aspect of the present invention, the insert plate of the locking mechanism is supported on the torsion spring for forward and backward movement in the sliding space of the handle, improving the overall actuation. Thus, the invention can tolerate more errors, thereby reducing the precision and difficulty in manufacturing. Further, the invention is applicable to different sizes and types of cabinets.

According to still another aspect of the present invention, the hook block of the positioning device is hooked in the retaining slot of the seat plate of the sliding box to secure the handle firmly in position after connection of the handle to the sliding box of the cabinet, locking the sliding box to the cabinet without vibration.

According to still another aspect of the present invention, the two position-limiting plates are curved from two opposite lateral sides of the handle shaft of the handle in direction toward each other, so that gaps are defined between the position-limiting plates and the handle shaft at two opposite lateral sides for the installation of the outer cover without significantly increasing the thickness of the handle. Further, the outer cover can be used to protect the torsion spring against impact and dust, prolonging the service life of the torsion spring.

According to still another aspect of the present invention, the two position-limiting plates are curved from two opposite lateral sides of the handle shaft of the handle in direction toward each other to form the respective arc-shaped lead edges that enhance the structural strength of the handle and facilitating grasping of the user's hand in a comfortable manner.

Other and further benefits, advantages and features of the present invention will be understood by reference to the following specification in conjunction with the accompanying drawings, in which like reference characters denote like elements of structure.

DETAILED DESCRIPTION OF THE PREFERRED EMBODIMENT

Figure 1:
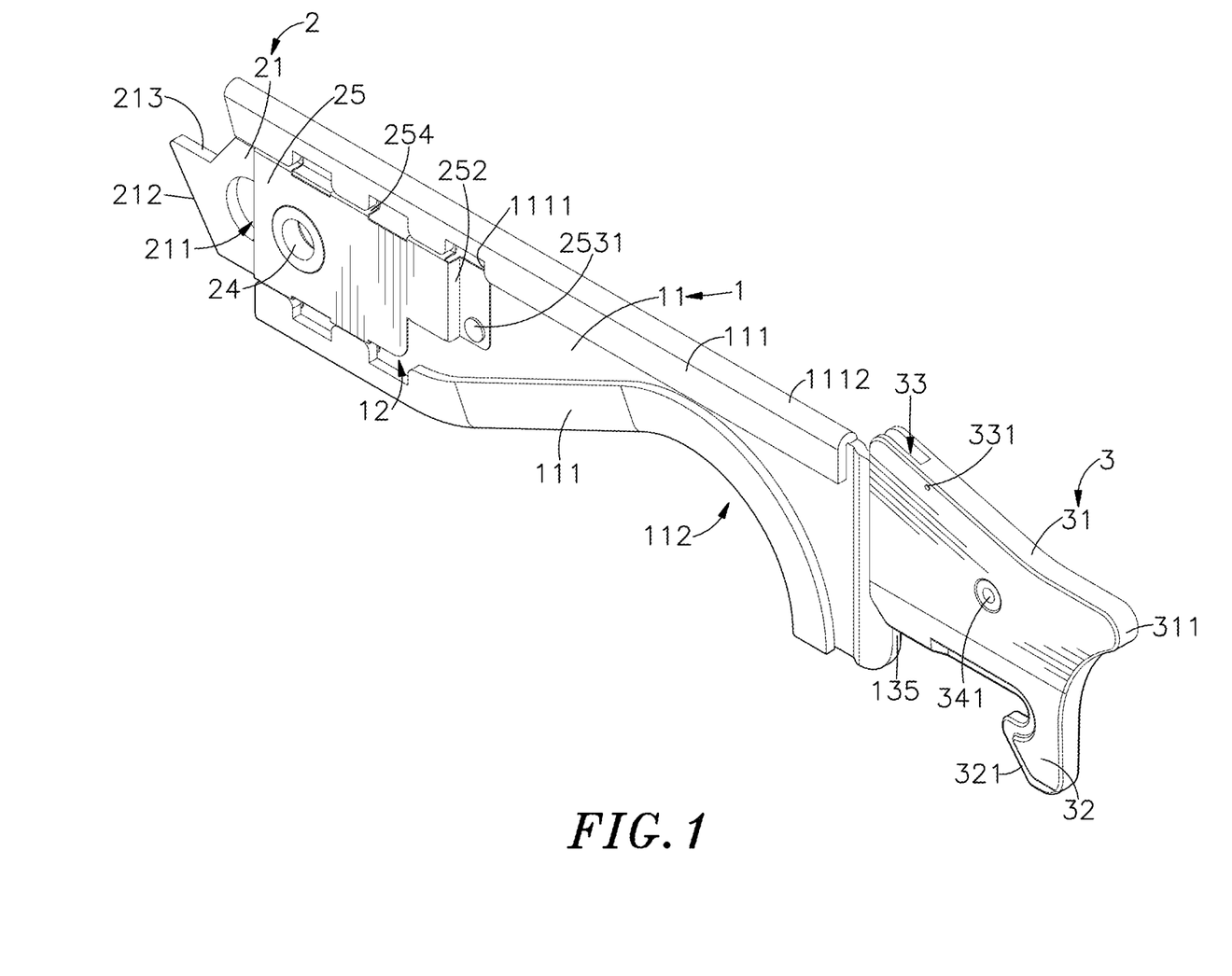
FIG. 1 is an oblique top elevational view of a handle mounting structure in accordance with the present invention.
Figure 2:
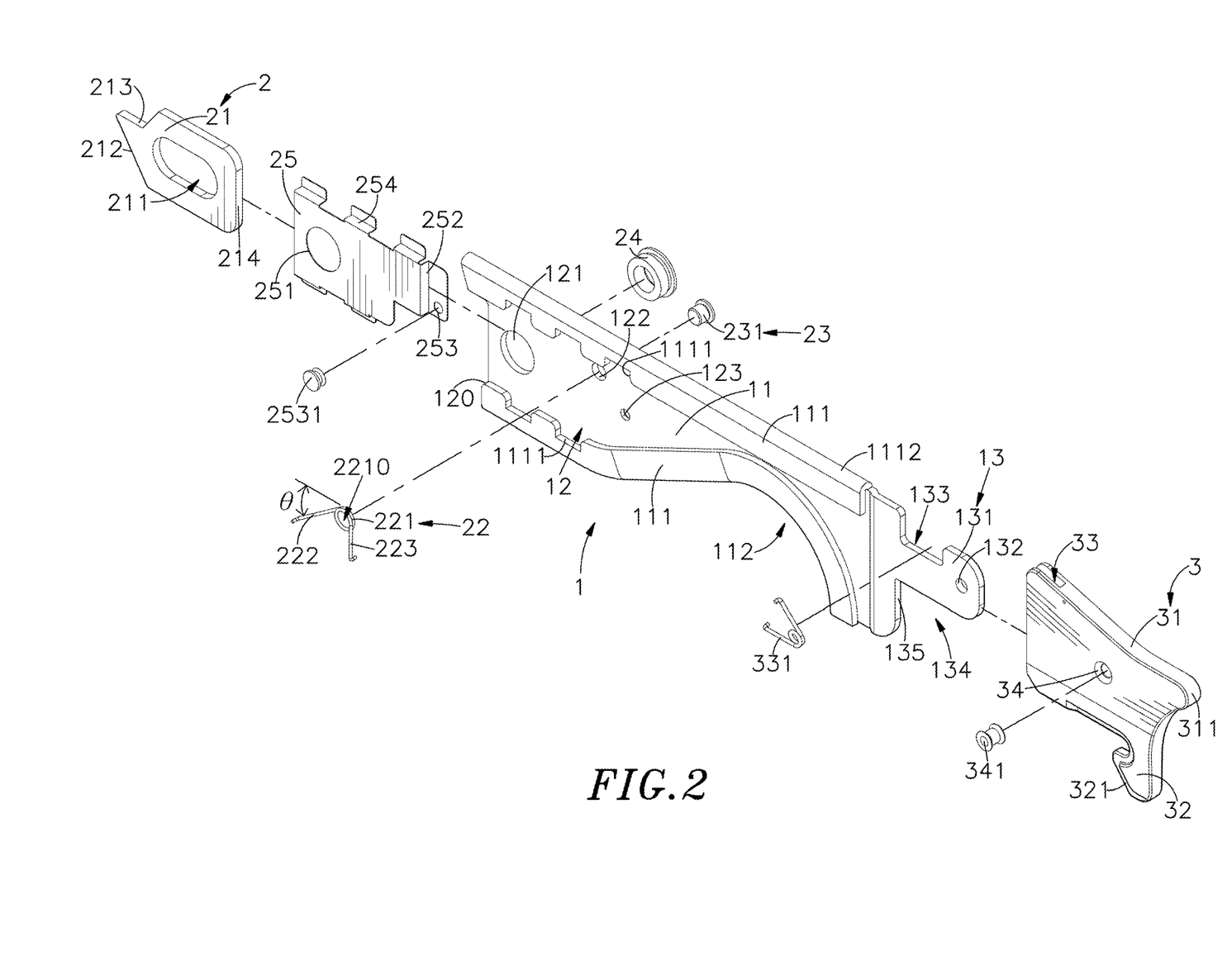
FIG. 2 is an exploded view of the handle mounting structure in accordance with the present invention.

Referring to FIGS. 1 and 2, a handle mounting structure in accordance with the present invention is shown. The handle mounting structure comprises a handle 1, a locking mechanism 2 and a positioning device 3.

The handle 1 comprises a handle shaft 11, two position-limiting plates 111 respectively curved from two opposite lateral sides of the handle shaft 11 in direction toward each other with a gap 110 defined between each position-limiting plate 111 and the handle shaft 11, a streamline type grip 112 extended from at least one side of the position-limiting plate 111, a sliding space 12 defined in a side of an opposing internal of the two position-limiting plates 111, an opening 120 defined in a side of the sliding space 12, a mounting hole 121, a locating hole 122 and a positioning hole 123 cut through the sliding space 12, and a mounting unit 13 extended from the handle shaft 11 and disposed at an opposite side of the sliding space 12. The mounting unit 13 comprises a mounting plate 131 extended from the handle shaft 11, a mounting through hole 132 cut through the mounting plate 131, an accommodation notch 133 located on a top side of the mounting plate 131, a swirl space 134 defined in the bottom side of the mounting plate 131, and a top edge 135 disposed at an inner side of the swirl space 134 and neighbored to the handle shaft 11. Further, two position-limiting plates 111 comprises a plurality of insertion grooves 1111 located on an inner side thereof and facing toward the sliding space 12, and an arc-shaped lead angle 1112 located on an opposing outer side thereof.

Figure 3:
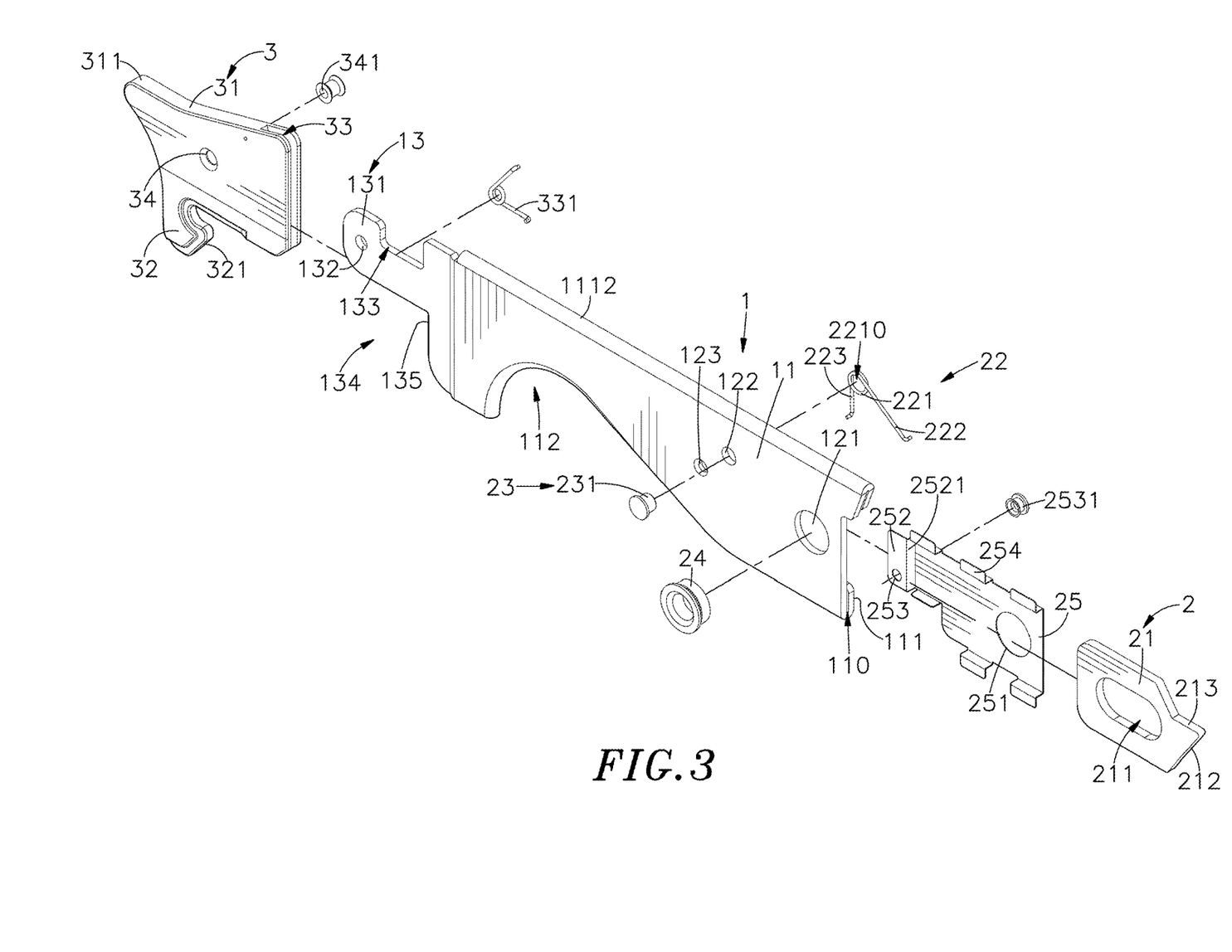
FIG. 3 corresponds to FIG. 2 when viewed from another angle.

The locking mechanism 2 comprises an insert plate 21, a torsion spring 22, a positioning axle 23, a connection axle 24 and an outer cover 25. The insert plate 21 is a flat member, comprising an oblong sliding slot 211 cut through two opposite sides thereof, a beveled sliding edge 212 located on one side thereof, a notch-shaped retaining edge 213 neighbored to a top side of the beveled sliding edge 212, and an abutment edge 214 located on an opposite side thereof for abutment against one end of the torsion spring 22. The torsion spring 22 is made of an elastic wire material (such as metal, rubber, plastic, synthetic resin or the like), comprising a coiled positioning portion 221 of winding direction parallel to the length direction of the handle 1, a through hole 2210 defined in the center of the coiled positioning portion 221, an abutment end piece 222 extended from one end of the coiled positioning portion 221 for abutment against the abutment edge 214 and defining with the horizontal line of the coiled positioning portion 221 a predetermined contained angle θ, and a mounting end piece 223 extended from one end of the coiled positioning portion 221. The positioning axle 23 has a shank 231 thereof inserted through the through hole 2210 in the coiled positioning portion 221 of the torsion spring 22. The connection axle 24 is inserted through the oblong sliding slot 211 of the insert plate 21. The outer cover 25 is covered on the insert plate 21, comprising a through hole 251 for the insertion of the connection axle 24, a stop plate 252 extended from one side thereof and defining an abutment surface 2521 for abutting the mounting end piece 223, a mounting through hole 253 cut through the stop plate 252 for the mounting of a fastening member 2531, and at least one positioning lug 254 extended from two opposite lateral sides of the outer cover 25.

The positioning device 3 comprises a flat base 31, a finger block 311 and a L-shaped hook block 32 respectively extended from opposing top and bottom sides of one end of the flat base 31, extended from flat base 31, a beveled guide edge 321 located on a front bottom side of the hook block 32, an engagement groove 33 defined in an opposite end of the flat base 31, a spring member 331 loaded in the engagement groove 33, an axle hole 34 cut through the flat base 31, and a pivot axle 341 mounted in the axle hole 34.

Further, the contained angle θ defined between the abutment end piece 222 and coiled positioning portion 221 of the torsion spring 22 is within 0~90°.

Figure 4:
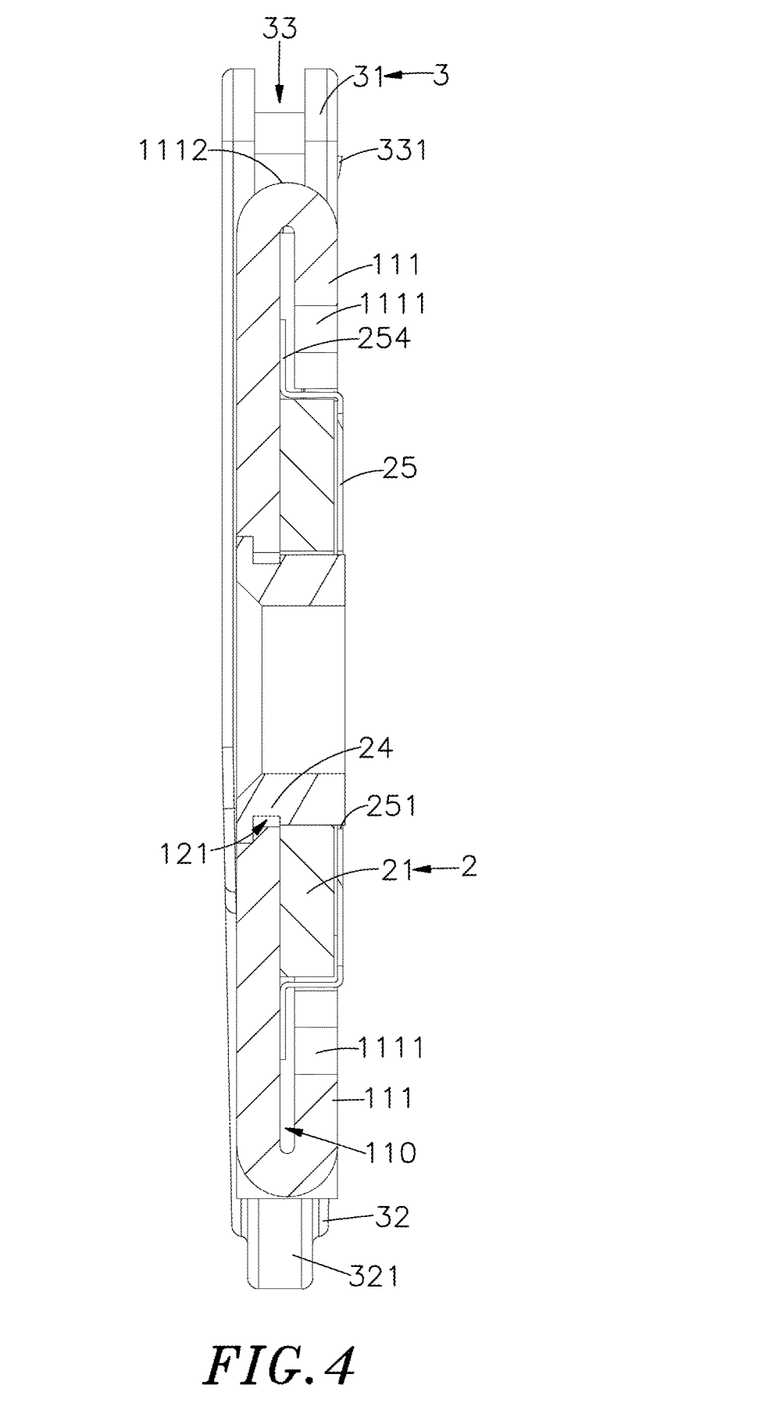
FIG. 4 is a sectional side of the handle mounting structure in accordance with the present invention.

In installation, insert the insert plate 21 of the locking mechanism 2 into the sliding space 12 of the handle 1 to let the beveled sliding edge 212 and retaining edge 213 of the insert plate 21 expose outside the opening 120 of the sliding space 12 and to keep the oblong sliding slot 211 of the insert plate 21 in axial alignment with the mounting hole 121, where the position-limiting plates 111 of the handle shaft 11 are stopped at the opposing top and bottom sides of the insert plate 21 for allowing the insert plate 21 to be stably moved in and out of the sliding space 12, then mount the positioning axle 23 in the locating hole 122, and then mount the coiled positioning portion 221 of the torsion spring 22 on the positioning axle 23 to let the shank 231 of the positioning axle 23 be inserted into the through hole 2210 in the coiled positioning portion 221, and then cover the outer cover 25 over the sliding space 12 to insert the positioning lugs 254 of the outer cover 25 through the respective insertion grooves 1111 of the position-limiting plates 111 into the gaps 110 and push the outer cover 25 forward relative to the handle shaft 11 to keep the through hole 251 of the outer cover 25 in axial alignment with the mounting hole 121 and the oblong sliding slot 211 and the mounting through hole 253 of the outer cover 25 in axial alignment with the positioning hole 123, and then insert the connection axle 24 through the mounting hole 121, the oblong sliding slot 211 and the through hole 251, and the fasten the fastening member 2531 to the mounting through hole 253 of the outer cover 25 and the positioning hole 123 of the handle 1 to affix the outer cover 25 to the sliding space 12 of the handle 1. After installation of the outer cover 25 in the sliding space 12, the abutment end piece 222 of the torsion spring 22 is set in abutment against the abutment edge 214 of the insert plate 21 and the mounting end piece 223 of the torsion spring 22 is set in abutment against the abutment surface 2521 of the stop plate 252 of the outer cover 25. Thus, the locking mechanism 2 is installed in the handle 1.

After installation of the locking mechanism 2 in the handle 1, mount the flat base 31 of the positioning device 3 to the mounting unit 13 of the handle 1 by: inserting the mounting plate 131 of the mounting unit 13 into the engagement groove 33 of the flat base 31, then load the spring member 331 into the engagement groove 33 within the accommodation notch 133 of the mounting plate 131, and then mount the pivot axle 341 in the axle hole 34 and the mounting through hole 132 of the mounting unit 1. At this point, the flat base 31 is abutted against the stop edge 135 of the mounting unit 13. When the finger block 311 of the flat base 31 is biased by an external force, the flat base 31 is turned about the axis of the axle hole 34 relative to the mounting unit 13, and the inner wall of the engagement groove 33 is forced to compress the spring member 331. When the biasing force is released from flat base 31, the elastic restoring energy of the spring member 331 immediately returns the flat base 31 into the swirl space 134. Thus, the handle 1, the locking mechanism 2 and the positioning device 3 are assembled to constitute the handle mounting structure.

In the present preferred embodiment, the outer cover 25 of the locking mechanism 2 comprises a plurality of positioning lugs 254 at each of the two opposite lateral sides thereof corresponding to the respective multiple insertion grooves 1111 on each of the two position-limiting plates 111, allowing the outer cover 25 to directly shield the sliding space 12 of the handle 1 and the positioning lugs 254 to be engaged into the respective multiple insertion grooves 1111. In another embodiment of the present invention, one single positioning lug 254 is provided at each of the two opposite lateral sides of the outer cover 25 (not shown). Alternatively, the position-limiting plates 111 can be configured without the aforesaid insertion grooves 1111. In this case, the outer cover 25 is directly inserted through the opening 120 into the sliding space 12 to force the positioning lugs 254 into the gaps 110 into friction engagement with respective inner surfaces of the position-limiting plates 111. After installation, the outer cover 25 keeps the sliding space 12 from sight.

Referring to FIGS. 5-8, in application of the handle mounting structure, the handle 1 is fastened to a seat plate 42 of a sliding box 41 in a cabinet 4 of a computer system. The seat plate 42 has a through hole 420 for the riveting of the connection axle 24 of the locking mechanism 2 to secure the handle 1 and the locking mechanism 2 to the through hole 420 of the seat plate 42. The seat plate 42 further provides a retaining slot 421 remote from the through hole 420. When the user biases the grip 112 of the handle shaft 11, the handle shaft 11 is moved to make a sector movement about the center of the through hole 420 of the seat plate 42 and the axis of the connection axle 24, the retaining edge 213 of the insert plate 21 of the locking mechanism 2 is engaged into an engagement hole 40 of the cabinet 4. Thereafter, push the handle shaft 11. At this point, the inner wall of the engagement hole 40 is abutted against the beveled sliding edge 212 of the insert plate 21, causing the abutment edge 214 of the insert plate 21 to compress the abutment end piece 222 of the torsion spring 22, and thus, the insert plate 21 is moved toward the inside of the sliding space 12 of the handle 1. At this time, the beveled sliding edge 212 of the insert plate 21 is smoothly forced into the engagement hole 40. After the beveled sliding edge 212 entered the engagement hole 40, the inside wall of the engagement hole 40 is released from the insert plate 21, allowing the abutment end piece 222 of the torsion spring 22 to return to its former shape and to push the insert plate 21 into the engagement hole 40, causing engagement between the retaining edge 213 of the insert plate 21 and the border edge of the engagement hole 40.

Figure 5:
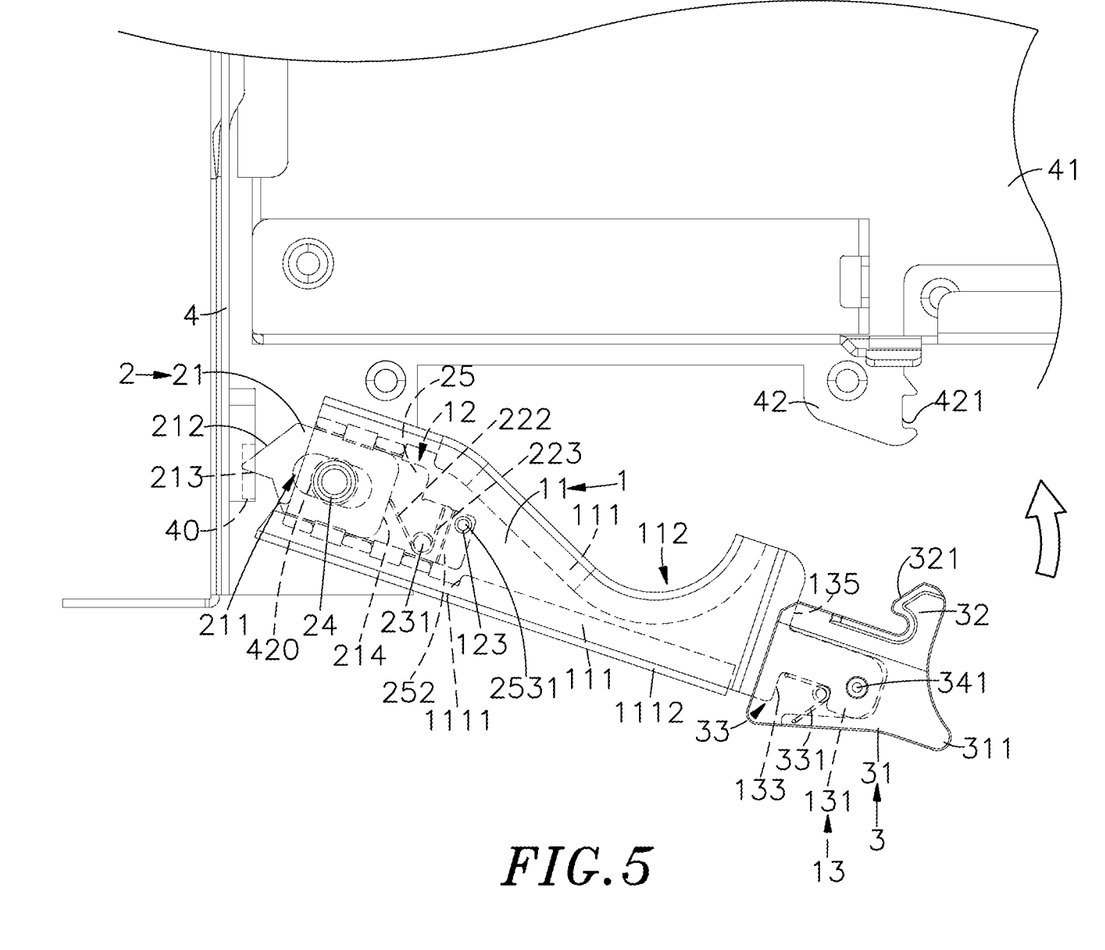
FIG. 5 is a schematic top view illustrating mounting of the handle mounting structure to a cabinet (I).
Figure 6:
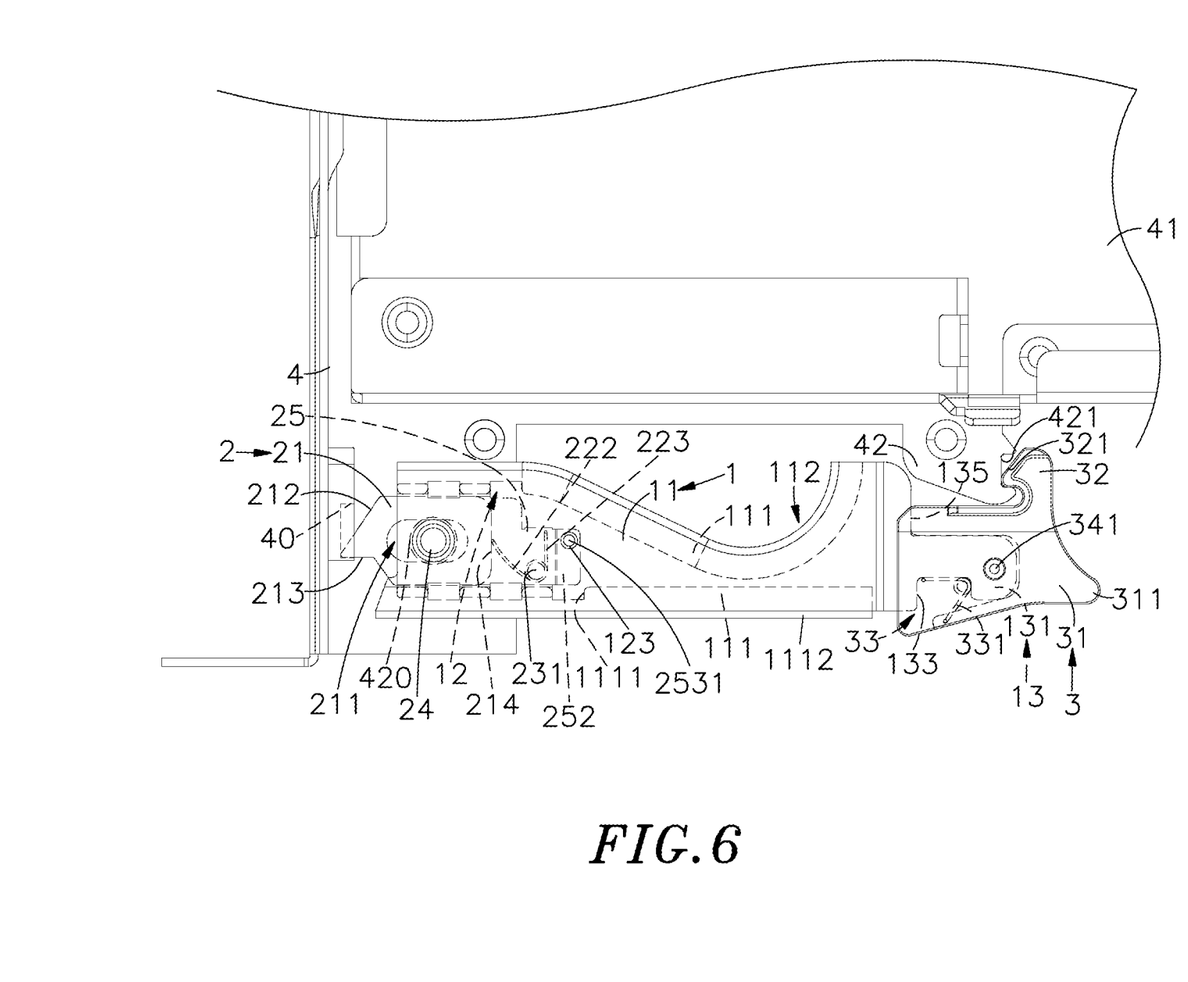
FIG. 6 is a schematic top view illustrating mounting of the handle mounting structure to a cabinet (II).

During the process of engaging the locking mechanism 2 into the engagement hole 40, the beveled guide edge 321 of the hook block 32 of the positioning device 3 is guided by the seat plate 42 so that the flat base 31 is biased outward in the swirl space 134, causing the inner wall of the engagement groove 33 to compress the spring member 331. Once the beveled guide edge 321 of the hook block 32 is released from the seat plate 42, the spring member 331 immediately returns to its former shape, and thus, the flat base 31 is returned to its former position. At this time, the hook block 32 of the positioning device 3 is hooked in the retaining slot 421 to secure the sliding box 41 firmly in the cabinet 4, and the handle 1 is positively secured to the cabinet 4 without vibration.

Figure 7:
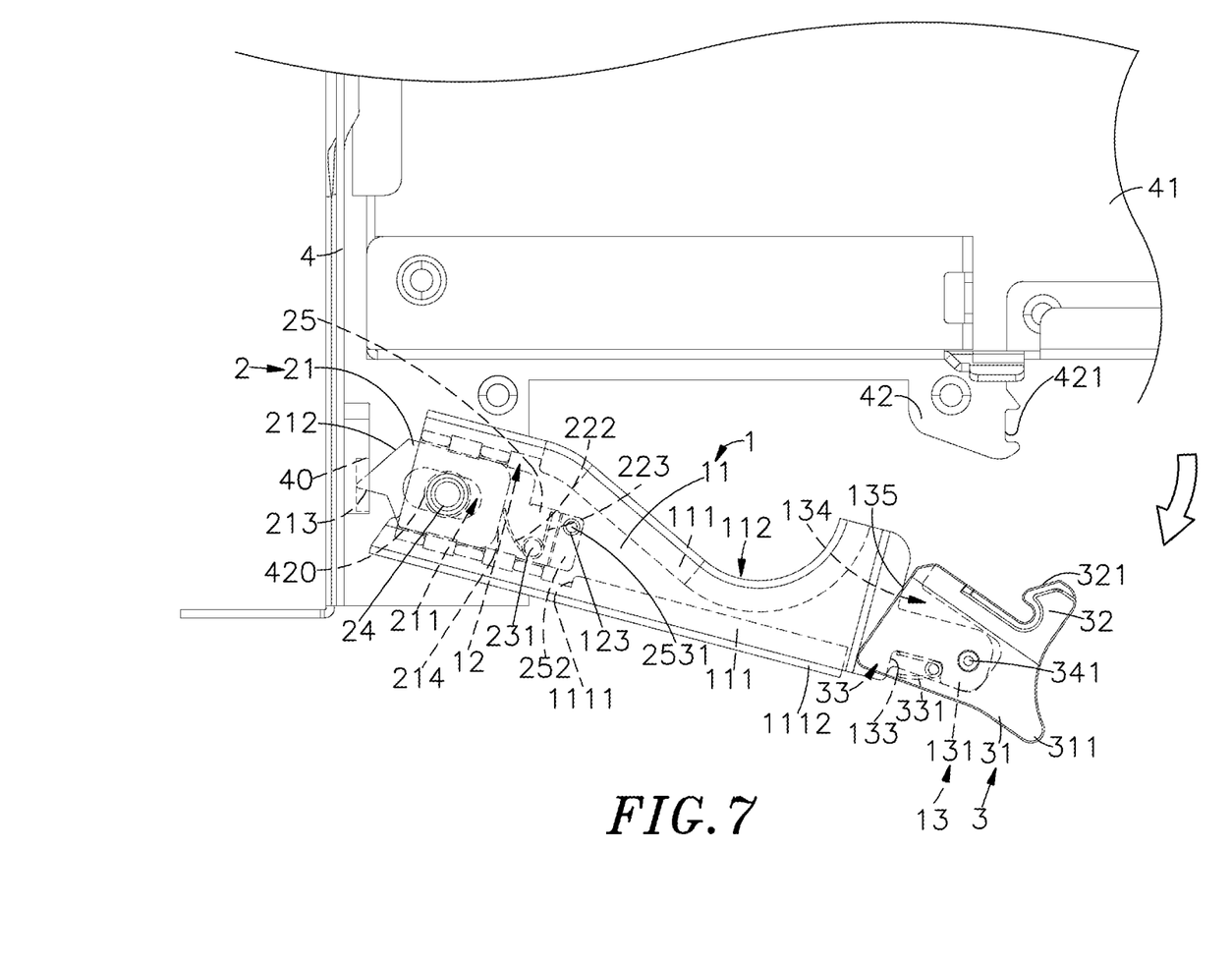
FIG. 7 is a schematic top view illustrating dismounting of the handle mounting structure from cabinet (I).
Figure 8:
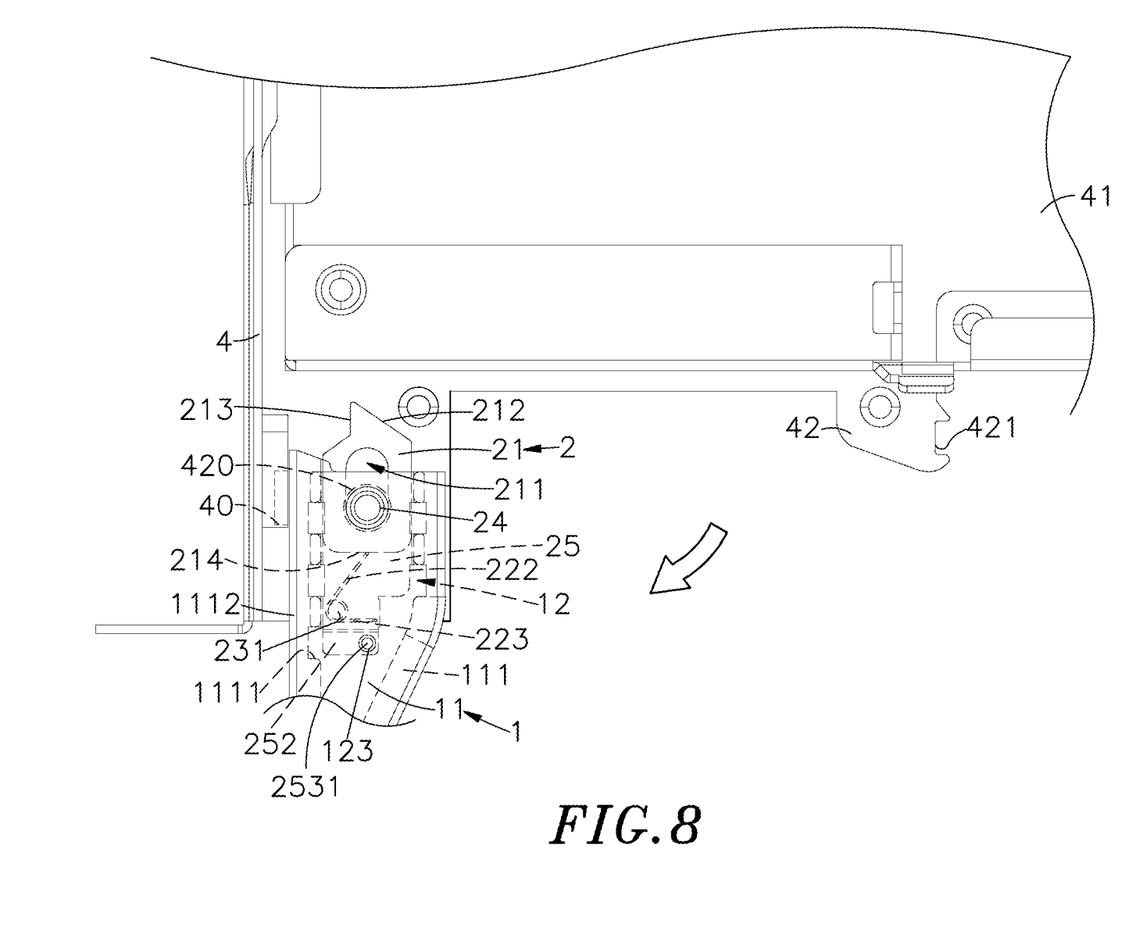
FIG. 8 is a schematic top view illustrating dismounting of the handle mounting structure from cabinet (II).

When wishing to pull the sliding box 41 out of the cabinet 4, bias the finger block 311 of the flat base 31 outwardly to disengage the hook block 32 of the positioning device 3 from the retaining slot 421 of the seat plate 42, and then bias the handle shaft 11 to move the insert plate 21 of the locking mechanism 2, forcing the beveled sliding edge 212 of the insert plate 21 against the inner wall of the engagement hole 40 of the cabinet 4. At this point, the abutment edge 214 of the insert plate 21 is forced against the abutment end piece 222 of the torsion spring 22 to compress the torsion spring 22 in the sliding space 12. Thereafter, pull the handle shaft 11 outward, and then rotate the handle shaft 11 to move the beveled sliding edge 212 of the insert plate 21 out of the engagement hole 40, thereby carrying the seat plate 42 and the sliding box 41 out of the cabinet 4. Thus, the handle 1 can be operated to unlock the sliding box 41 from the cabinet 4, allowing removal of the sliding box 41 out of the cabinet 4.

The connection axle 24 of the locking mechanism 2 is preferably riveted to the through hole 420 of the seat plate 42. However, in actual application, the connection axle 24 can be configured to provide an internal thread. When mounting the connection axle 24 in the through hole 420, a fastening member is threaded into the internal thread of the connection axle 24 to lock the connection axle 24 to the seat plate 42. Many various other known techniques can be employed to fasten the connection axle 24 of the locking mechanism 2 to the through hole 420 of the seat plate 42 without departing from the spirit and scope of the present invention.

By means of biasing and hooking, the handle 1 is fastened to an outer side of the sliding box 41 in the cabinet 4 efficiently with less effort. In actual application, the handle 1 can be directly pushed toward the seat plate 42 of the cabinet 4. Subject to the mating design between the beveled sliding edge 212 at one side of the insert plate 21 of the locking mechanism 2 and the beveled guide edge 321 at one side of the hook block 32 of the positioning device 3, a guiding effect is provided when the handle 1 is pushed toward the seat plate 42 of the cabinet 4, causing displacement of the insert plate 21 of the locking mechanism 2 and the flat base 31 of the positioning device 3 along the beveled sliding edge 212 and the beveled guide edge 321 respectively, so that the engagement hole 40 of the cabinet 4 and the retaining slot 421 of the seat plate 42 can be positively connected. In this way, the intuitiveness of the operation can be improved by directly pushing in and combining, so as to achieve convenience and simplify the operation and use.

In summary, the invention has the following advantages and features:

1. The two opposite sides of the handle 1 are fastened to the sliding box 41 in the cabinet 4 by the locking mechanism 2 and the positioning device 3 respectively so that the handle 1 is firmly secured to the sliding box 41 without vibration and can be operated to push the sliding box 41 into the cabinet 4 or to pull the sliding box 41 out of the cabinet 4. Further, the winding direction of the coiled positioning portion 221 of the torsion spring 22 of the locking mechanism 2 is parallel to the length direction of the handle 1 so that the thickness of the torsion spring 22 is minimized, making the handle 1 relatively thinner for use in an electronic product having light, thin, short and small characteristics.

2. The outer cover 25 of the locking mechanism 2 is detachably mounted in the sliding space 12 of the handle 1, facilitating replacement of the torsion spring 22 after dismounting of the outer cover 25. Further, the outer cover 25 is set in position by means of engaging the positioning lugs 254 thereof into the two opposite gaps 110 in handle shaft 11 without additional fastening members, facilitating quick installation.

3. The insert plate 21 of the locking mechanism 2 is supported on the torsion spring 22 for forward and backward movement in the sliding space 12 of the handle 1, improving the overall actuation. Thus, the invention can tolerate more errors, thereby reducing the precision and difficulty in manufacturing. Further, the invention is applicable to different sizes and types of cabinets 4.

4. After connection of the handle 1 to the sliding box 41 of the cabinet 4, the hook block 32 of the positioning device 3 is hooked in the retaining slot 421 of the seat plate 42 of the sliding box 41 to secure the handle 1 firmly in position, locking the sliding box 41 to the cabinet 4 without vibration.

5. The two position-limiting plates 111 are curved from two opposite lateral sides of the handle shaft 11 of the handle 1 in direction toward each other, so that the gaps 110 are defined between the position-limiting plates 111 and the handle shaft 11. Through the gaps 110, the sliding space 12 is allowed for the installation of the outer cover 25, and the outer cover 25 can be used to protect the torsion spring 22 against impact and dust, prolonging the service life of the torsion spring 22.

6. The two position-limiting plates 111 are curved from two opposite lateral sides of the handle shaft 11 of the handle 1 in direction toward each other to form the respective arc-shaped lead edges 1112 that enhance the structural strength of the handle 1 and facilitating grasping of the user's hand in a comfortable manner.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A handle mounting structure, comprising:
a handle comprising a handle shaft, a sliding space defined in one side of said handle shaft and a mounting unit located at one end of said handle shaft;
a locking mechanism mounted in said sliding space of said handle, said locking mechanism comprising an insert plate slidably inserted into said sliding space and a torsion spring mounted in said sliding space of said handle and stopped between said handle and said insert plate to impart a pressure to said insert plate toward the outside of said sliding space, said torsion spring comprising a coiled positioning portion mounted to said handle shaft within said sliding space, an abutment end piece extended from one end of said coiled positioning portion and stopped against said insert plate and a mounting end piece extended from an opposite end of said coiled positioning portion and positioned in said sliding space; and
a positioning device comprising a flat base pivotally coupled to said mounting unit of said handle and a hook block located at a bottom side of said flat base;
wherein said handle further comprises two position-limiting plates respectively curved from two opposite lateral sides of said handle shaft in direction toward each other with a gap defined between each said position-limiting plate; said locking mechanism further comprises an outer cover disposed at an outer side relative to said insert plate and covered on said two position-limiting plates of said handle over said sliding space, said outer cover comprising a plurality of positioning lugs respectively extended from two opposite lateral sides thereof and positioned in the said gaps between said two position-limiting plates and said handle shaft.

2. The handle mounting structure as claimed in claim 1, wherein each said position-limiting plate comprises a plurality of insertion grooves disposed in communication with an inner side of said sliding space.

3. The handle mounting structure as claimed in claim 1, wherein each said position-limiting plate comprises an arc-shaped lead edge located on an outer side thereof.

4. The handle mounting structure as claimed in claim 1, wherein said handle further comprises a streamline-shaped grip extended from one end of said handle shaft.

5. The handle mounting structure as claimed in claim 1, wherein said handle further comprises an opening defined in one end of the sliding space; said insert plate of said locking mechanism comprises a beveled sliding edge located on one end thereof, a retaining edge neighbored to a top side of said beveled sliding edge, and an abutment edge located on an opposite end thereof for abutment against said abutment end piece of said torsion spring.

6. The handle mounting structure as claimed in claim 1, wherein said handle further comprises a mounting hole cut through said handle shaft and disposed in communication with said sliding space; said insert plate of said locking mechanism comprises an oblong sliding slot; said locking mechanism further comprises an outer cover disposed at an outer side relative to said insert plate and covered on said two position-limiting plates of said handle over said sliding space, said outer cover comprising a through hole; said locking mechanism further comprises a connection axle mounted in said mounting hole of said handle, said oblong sliding slot of said insert plate and said through hole of said outer cover for allowing said insert plate to be moved linearly relative to said handle and said outer cover.

7. The handle mounting structure as claimed in claim 1, wherein said handle further comprises a locating hole cut through said handle shaft and disposed in communication with said sliding space; said coiled positioning portion of said torsion spring defines therein a through hole; said locking mechanism further comprises a positioning axle with a shank thereof mounted in said locating hole of said handle and inserted through the said through hole of said torsion spring.

8. The handle mounting structure as claimed in claim 1, wherein said handle further comprises a positioning hole cut through said handle shaft and disposed in communication with said sliding space; said locking mechanism further comprises an outer cover disposed at an outer side relative to said insert plate and covered on said two position-limiting plates of said handle over said sliding space, said outer cover comprising a stop plate defining an abutment surface for the abutment of said mounting end piece and a mounting through hole cut through said stop plate and connected to said positioning hole of said handle with a fastening member.

9. The handle mounting structure as claimed in claim 1, wherein said mounting unit of said handle comprises a mounting plate extended from said handle shaft, a mounting through hole cut through said mounting plate, an accommodation notch located on a top side of said mounting plate, a swirl space defined in an opposing bottom side of said mounting plate for allowing said flat base of said positioning device to move therein, and a top edge disposed at an inner side of said swirl space and neighbored to said handle shaft; said positioning device further comprises an engagement groove defined in said flat base for receiving said mounting plate, a spring member loaded in said engagement groove and positioned in said accommodation notch, an axle hole cut through said flat base, and a pivot axle mounted in said axle hole and pivotally connected to said mounting through hole of said mounting unit.

10. The handle mounting structure as claimed in claim 1, wherein the winding direction of said coiled positioning portion of said torsion spring is parallel to the length direction of said handle; said abutment end piece defines with the horizontal line of said coiled positioning portion a predetermined contained angle within 0~90°.

11. The handle mounting structure as claimed in claim 1, wherein said positioning device further comprises a finger block extended from a top side of one end of said flat base; said hook block of said positioning device comprises a beveled guide edge located on a front bottom side thereof.

\* \* \* \* \*